United States Patent

Kurashima

[11] Patent Number: 5,334,887
[45] Date of Patent: Aug. 2, 1994

[54] ECL LATCH CIRCUIT

[75] Inventor: Yasumi Kurashima, Tokyo, Japan

[73] Assignee: NEC Corporation, Tokyo, Japan

[21] Appl. No.: 60,851

[22] Filed: May 12, 1993

[30] Foreign Application Priority Data

May 12, 1992 [JP] Japan .................. 4-146688

[51] Int. Cl.$^5$ .................. H03K 19/20; H03K 3/01
[52] U.S. Cl. .................. 307/455; 307/272.3; 307/272.1
[58] Field of Search .................. 307/455, 443, 272.1, 307/272.2, 272.3

[56] References Cited

U.S. PATENT DOCUMENTS

| | | | |
|---|---|---|---|
| 4,877,977 | 10/1989 | Kokado | 307/455 |
| 5,155,383 | 10/1992 | Barbera | 307/272.3 |
| 5,170,079 | 12/1992 | Komatsu | 307/272.1 |
| 5,220,212 | 6/1993 | Sinh | 307/455 |
| 5,237,220 | 8/1993 | Kurashima | 307/455 |

OTHER PUBLICATIONS

Jerry Prioste et al., "MCA2500ECL and MCA800ECL Macrocell Array Design Manual", Motorola Inc., 1986.

Primary Examiner—Edward P. Westin
Assistant Examiner—Andrew Sanders

[57] ABSTRACT

An ECL latch circuit includes a logic section and has a reset or set function. The logic section includes a first to seventh transistors. The third transistor has a collector connected to the collector of the first transistor, and a base for receiving a first reference potential or the collector potential of the second transistor through an emitter follower section. The fourth transistor has a collector connected to the collector of the second transistor, a base for receiving a collector potential of the first transistor through an emitter follower section or receiving a first reference potential, and an emitter connected to the emitter of the third transistor. The fifth transistor has a collector connected to the collector of the second or first transistor, a base for receiving a reset or set signal, and an emitter connected to the emitter of the third transistor.

8 Claims, 4 Drawing Sheets

ECL LATCH CIRCUIT

BACKGROUND OF THE INVENTION

The present invention relates to an emitter coupled logic (to be referred to as an ECL hereinafter) latch circuit and, more particularly, to a latch circuit having a set or reset function.

FIG. 3 shows the arrangement of a conventional ECL latch circuit having a reset function. Referring to FIG. 3, reference symbol EF1 denotes an input emitter follower section; L3, a logic section; EF3, an output emitter follower section; and EF4, an internal emitter follower section.

The input emitter follower section EF1 has a transistor Q1 and a resistor R3. The internal emitter follower section EF4 has transistors Q11 and Q12 and resistors R4, R7, R8, and R9. The logic section L3 has transistors Q2, Q3, Q4, Q5, Q6, Q7, and Q8, resistors R1 and R2, and a constant current source CS, in addition to the internal emitter follower section EF4.

The output emitter follower section EF3 also includes transistors Q9 and Q10 and resistors R5 and R6.

When a latch strobe signal input to a latch strobe signal input terminal TE is at high level, the transistor Q1 of the input emitter follower section EF1 is turned on. As a result, the transistor Q7 is turned on. One of the transistors Q3, Q4, and Q6 which has the highest base potential is also turned on to determine a logical value.

In this case, signals input to the bases of the transistors Q3 and Q4 are level-shifted by the resistors R7 and R8 so that the high level of a signal at a reset signal input terminal TRE becomes higher than the base potentials of both the transistors Q3 and Q4. With this setting, a reset function is ensured. As such a circuit, an ECL gate array latch circuit available from Motorola/UDS is disclosed in the MACROCELL ARRAYS MCA2500ECL design manual (p. 6).

Similar to the ECL latch circuit shown in FIG. 3, a conventional ECL latch circuit having a set function is designed such that the high level of a set signal becomes higher than the base potentials of both transistors Q3 and Q4 by using level shift resistors, as shown in FIG. 4.

In the conventional ECL latch circuit having the reset function shown in FIG. 3, if level shifts performed by the level shift resistors R7 and R8 are too large, the emitter potentials of the transistors Q3 and Q4 are decreased too much, resulting in saturation of the transistor Q7, or a current flowing in the internal emitter follower section EF4 decreases, resulting in a decrease in operation speed.

For this reason, the level shifts in the conventional latch circuit are set to be about 150 mV. Assume that the logic amplitude of the circuit is 600 mV, that the potential difference between the base and emitter of each of the transistors Q11 and Q12 is 800 mV, and that a supply voltage VE is −4.5 V. In this case, a potential difference between the resistors R9 and R4 becomes 3.55 V in a high-level state, and 2.95 V in a low-level state. Since a current flowing in the resistors R7 and R4 is equal to a current flowing in the resistors R8 and R9, the resistance of the level shift resistors R7 and R8 is about 1/20 to 1/24 that of the emitter follower resistors R9 and R4.

If, therefore, all resistors are formed of optimal layer resistors for the frequently used emitter follower resistors, the width of a level shifter resistor becomes several time larger than that of a emitter follower resistor even if the length of the level shift resistor is decreased as much as possible in terms of reliability and fabrication. Consequently, the level shift register has an extremely large element area, resulting in an increase in overall circuit area.

Especially in an ECL gate array, the above-described level shift resister must be arranged in each cell, regardless of whether the resistor is used or not, in order to allow a latch circuit with a set or reset function to be formed in any internal cell. Therefore, the overall chip area is inevitably increased regardless of whether a latch circuit with a set or reset function is used or not.

The difference between the high level of the reset signal and the high level of the base potential of each of the transistors Q3 and Q4 is about 150 mV, which is about half a normal logic noise margin of 300 mV (half a logic amplitude of 600 mV). For this reason, operation errors tend to occur.

Note that the problems in the above-described conventional latch circuit with the reset function are the same as those in a latch circuit with a set function.

SUMMARY OF THE INVENTION

It is an object of the present invention to provide an ECL latch circuit which allows a reduction in circuit area by omitting level shift registers which are required in the prior art to perform a reliable set or reset operation, and can prevent operation errors by ensuring a sufficient noise margin with respect to a set or reset signal.

In order to achieve the above object, according to the present invention, there is provided an ECL latch circuit comprising a logic section and having a reset function, the logic section including a first transistor, a second transistor, a third transistor, a fourth transistor, a fifth transistor, a sixth transistor, and a seventh transistor, the first transistor having a collector connected to a ground potential through a first load resistor, and a base serving as a first signal input terminal, the second transistor having a collector connected to the ground potential through a second load resistor, a base serving as a second signal input terminal, and an emitter connected to an emitter of the first transistor, the third transistor having a collector connected to the collector of the first transistor, and a base for receiving a first reference potential, the fourth transistor having a collector connected to the collector of the second transistor, a base for receiving a collector potential of the first transistor through an emitter follower section, and an emitter connected to an emitter of the third transistor, the fifth transistor having a collector connected to the collector of the second transistor, a base for receiving a reset signal, and an emitter connected to the emitter of the third transistor, the sixth transistor having a collector connected to the emitter of the third transistor, a base serving as a third signal input terminal, and an emitter connected to a low-potential side power supply through a constant current source, and the seventh transistor having a collector connected to the emitter of the first transistor, a base serving as a fourth signal input terminal, and an emitter connected to the emitter of the sixth transistor.

In addition, according to the present invention, there is provided an ECL latch circuit comprising a logic section and having a set function, the logic section including a first transistor, a second transistor, a third transistor, a fourth transistor, a fifth transistor, a sixth transistor, and a seventh transistor, the first transistor having a collector connected to a ground potential through a first load resistor, and a base serving as a first signal input terminal, the second transistor having a collector connected to the ground potential through a second load resistor, a base serving as a second signal input terminal, and an emitter connected to an emitter of the first transistor, the third transistor having a collector connected to the collector of the first transistor, and a base for receiving a collector potential of the second transistor through an emitter follower section, the fourth transistor having a collector connected to the collector of the second transistor, a base for receiving a first reference potential, and an emitter connected to an emitter of the third transistor, the fifth transistor having a collector connected to the collector of the first transistor, a base for receiving a set signal, and an emitter connected to the emitter of the third transistor, the sixth transistor having a collector connected to the emitter of the third transistor, a base serving as a third signal input terminal, and an emitter connected to a low-potential side power supply through a constant current source, and the seventh transistor having a collector connected to the emitter of the first transistor, a base serving as a fourth signal input terminal, and an emitter connected to the emitter of the sixth transistor.

DESCRIPTION OF THE PREFERRED EMBODIMENTS

The present invention will be described below with reference to the accompanying drawings.

Figure 1:
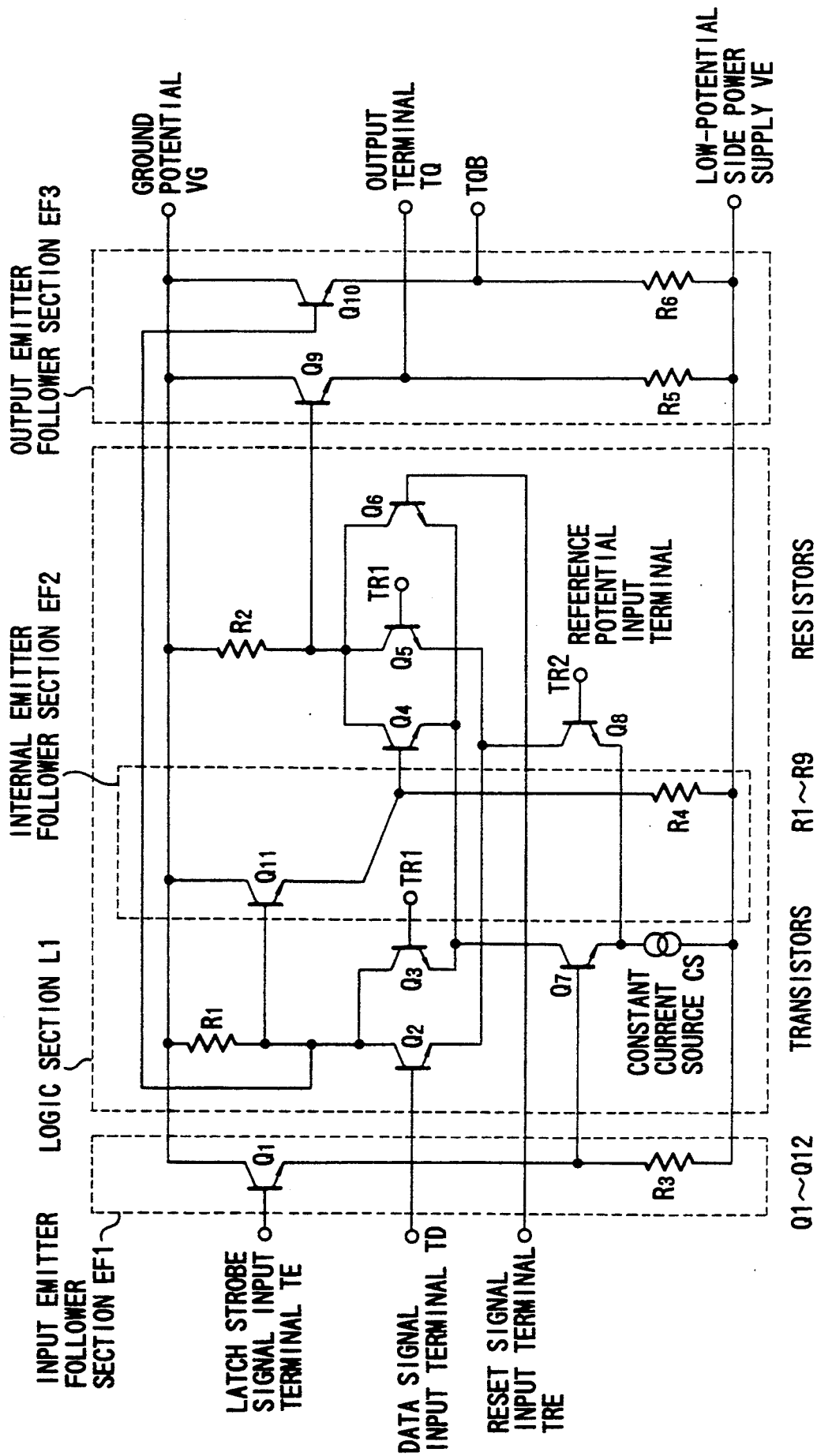
FIG. 1 is a circuit diagram showing a latch circuit having a reset function according to the first embodiment of the present invention.

FIG. 1 shows a latch circuit having a reset function according to the first embodiment of the present invention. This circuit includes a logic section L1, an input emitter follower section EF1, and an output emitter follower section EF3.

The logic section L1 is constituted by a first transistor Q2, a second transistor Q5, a third transistor Q3, a fourth transistor Q4, a fifth transistor Q6, a sixth transistor Q7, and a seventh transistor Q8. The collector of the first transistor Q2 is connected to a ground potential VG through a first load resistor R1. The base of the transistor Q2 serves as a data input terminal TD. The collector of the second transistor Q5 is connected to the ground potential VG through a second load resistor R2. The base of the transistor Q5 serves as a reference potential input terminal TR1. The emitter of the transistor Q5 is connected to the emitter of the first transistor Q2. The collector of the third transistor Q3 is connected to the collector of the first transistor Q2. The base of the transistor Q3 receives a reference potential from the reference potential input terminal TR1. The collector of the fourth transistor Q4 is connected to the collector of the second transistor Q5. The base of the transistor Q4 receives the collector potential of the first transistor Q2 through an emitter follower section EF2. The emitter of the transistor Q4 is connected to the emitter of the third transistor Q3. The collector of the fifth transistor Q6 is connected to the collector of the second transistor Q5. The base of the transistor Q6 receives a reset signal from a reset signal input terminal TRE. The emitter of the transistor Q6 is connected to the emitter of the third transistor Q3. The collector of the sixth transistor Q7 is connected to the emitter of the third transistor Q3. The base of the transistor Q7 receives a latch strobe signal from a latch strobe signal input terminal TE through an input emitter follower section EF1. The emitter of the transistor Q7 is connected to a low-potential side power supply VE through a constant current source CS. The collector of the seventh transistor Q8 is connected to the emitter of the first transistor Q2. The base of the transistor Q8 serves as a second reference potential input terminal TR2. The emitter of the transistor Q8 is connected to the emitter of the sixth transistor Q7.

The internal emitter follower section EF2 is constituted by an emitter follower transistor Q1 and an emitter follower resistor R4 (or a constant current source). The emitter of the emitter follower transistor Q11 serves as an output terminal.

The input emitter follower section EF1 is constituted by a transistor Q1 and a resistor R3. The output emitter follower section EF3 is constituted by transistors Q9 and Q10 and resistors R5 and R6.

When a latch strobe signal input to the latch strobe signal input terminal TE is at high level, the transistor Q7 is turned on, and one of the transistors Q3, Q4, and Q6 which has the highest base potential is turned on, thus determining a logic value.

Assume that a reset signal to the reset signal input terminal TRE is set at high level. In this case, since the base potential of the transistor Q3 is the reference potential of the first reference potential input terminal TR1, a current flows on the load resistor R2 side regardless of whether the base of the transistor Q4 is at high level or low level. Consequently, output signals from output terminals TQ and TQB are set at low level and high level, respectively, thereby allowing a reliable operation of the reset function without level shift resistors required in the prior art.

With the circuit arrangement of the embodiment, level shift resistors which are considerably larger in size than other resistors are not required, and hence a reduction in circuit occupation area can be realized. This effect is especially conspicuous in an ECL latch circuit, allowing nearly a 10% reduction in overall chip area.

In the circuit of the embodiment, the logic value is determined based on the base potential of the transistor Q3 and the base potential of the transistor Q4 or Q6, and the base potential of the transistor Q3 serves as a reference potential. For this reason, a noise margin equivalent to half the logic amplitude can be ensured, similar to the normal logic. Therefore, operation errors associated with a reset signal can be prevented.

Figure 2:
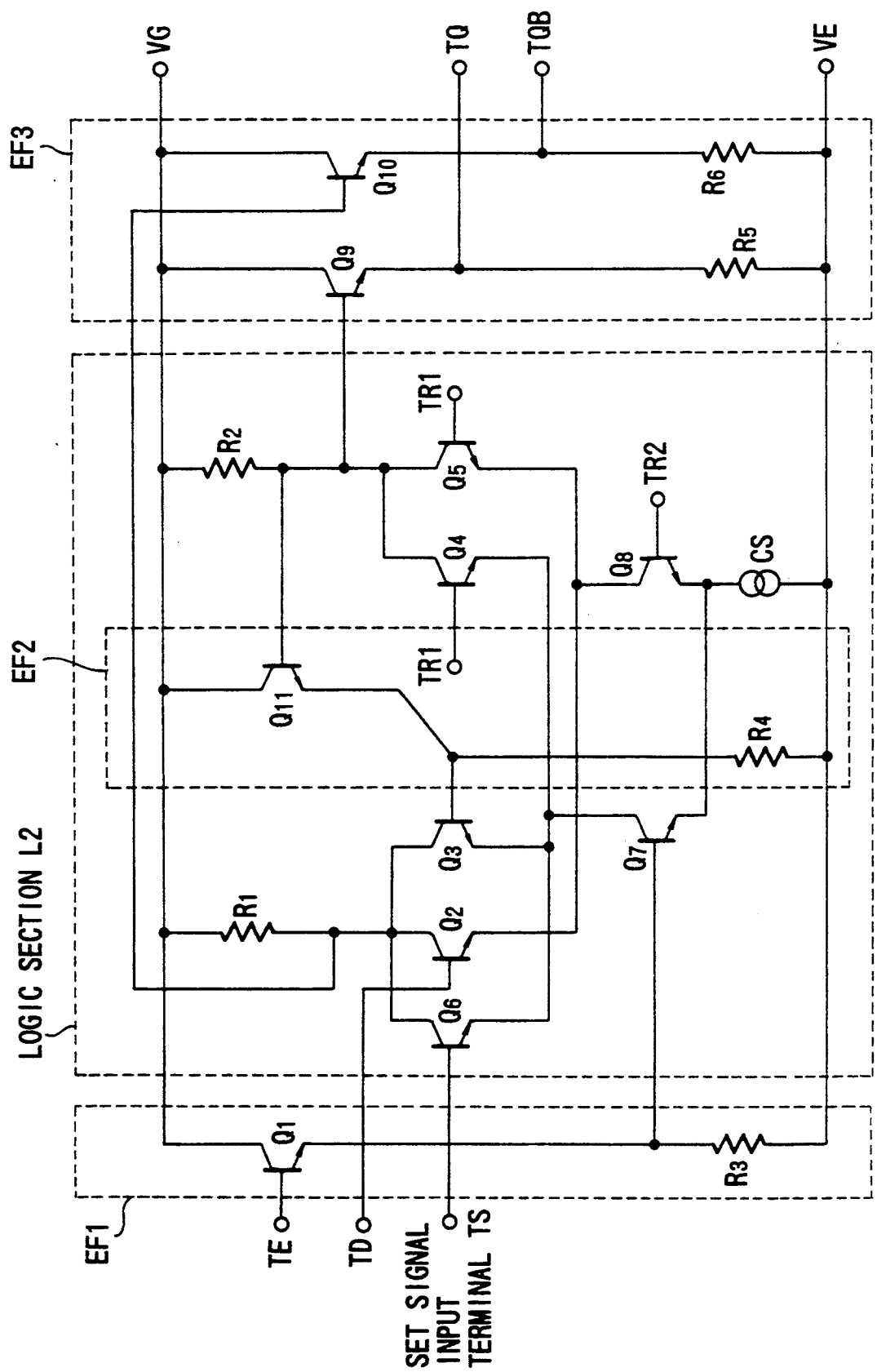
FIG. 2 is a circuit diagram showing a latch circuit having a set function according to the second embodiment of the present invention.
Figure 3:
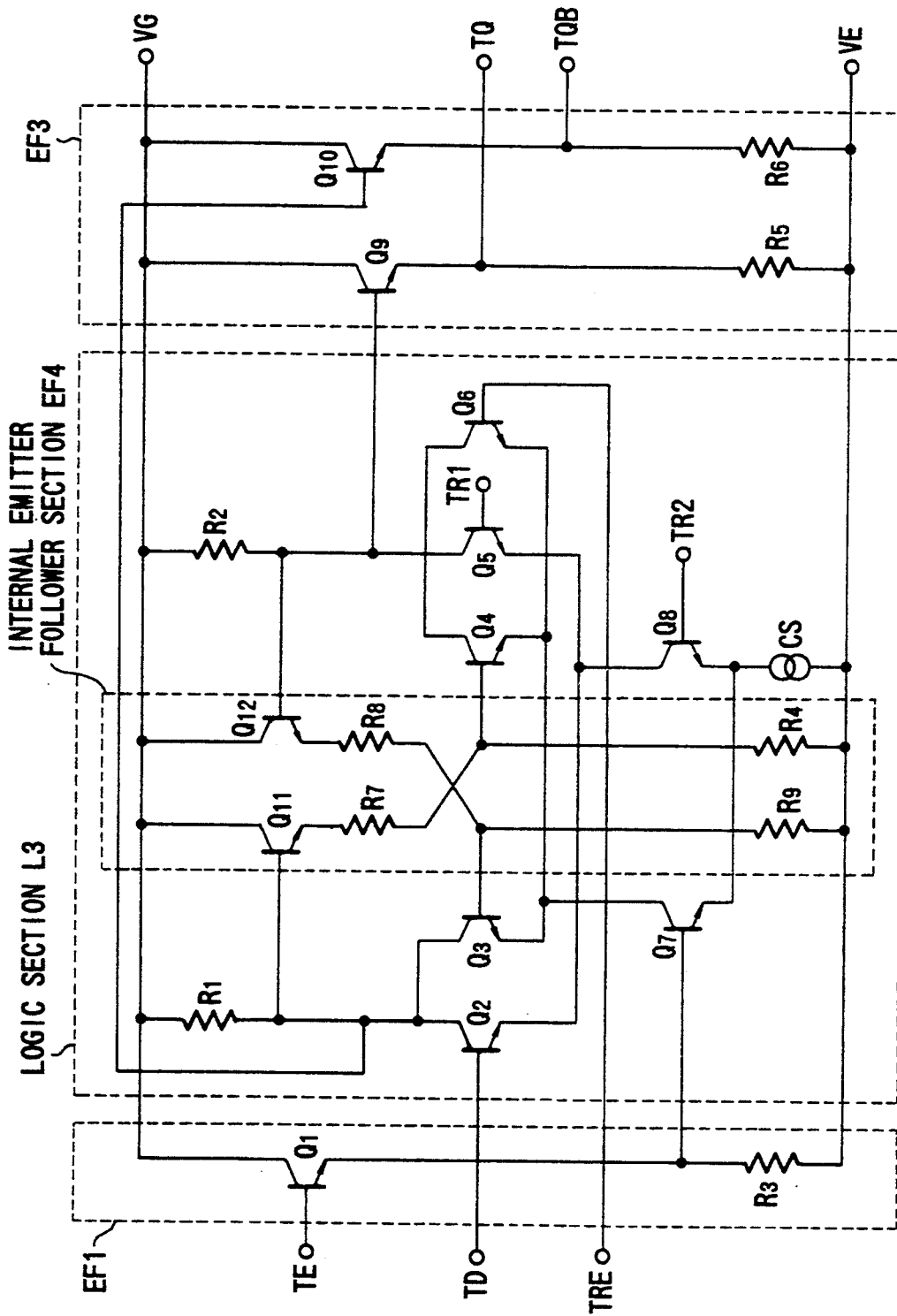
FIG. 3 is a circuit diagram showing a conventional latch circuit having a reset function.
Figure 4:
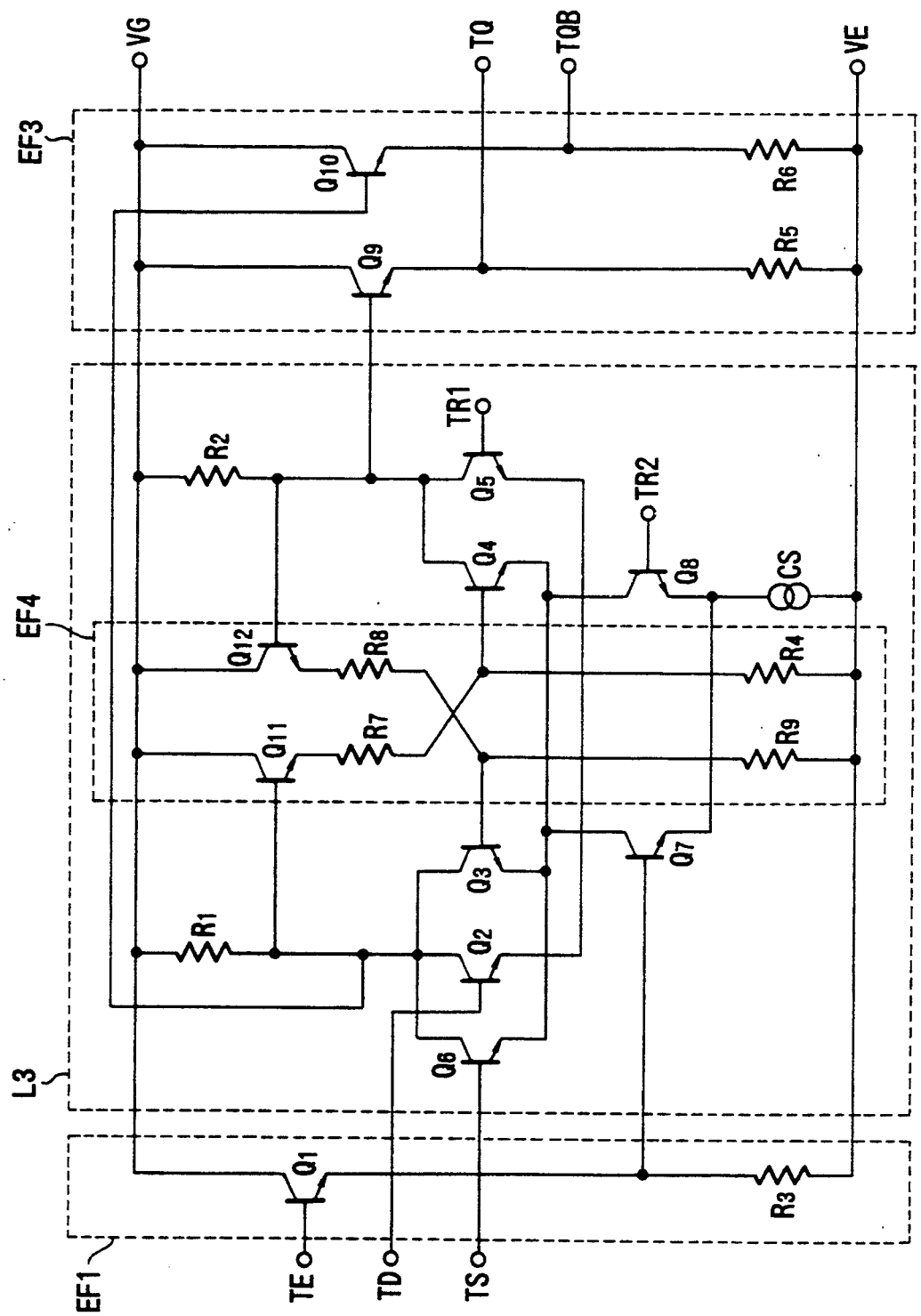
FIG. 4 is a circuit diagram showing a conventional latch circuit having a set function.

FIG. 2 shows a latch circuit having a set function according to the second embodiment of the present invention. A logic section L2 according to this embodiment is constituted by a first transistor Q2, a second transistor Q5, a third transistor Q3, a fourth transistor Q4, a fifth transistor Q6, a sixth transistor Q7, and a seventh transistor Q8. The collector of the first transistor Q2 is connected to a ground potential VG through a first load resistor R1. The base of the transistor Q2 serves as a data input terminal TD. The collector of the second transistor Q5 is connected to the ground potential VG through a second load resistor R2. The base of the transistor Q5 serves as a reference potential input terminal TR1. The emitter of the transistor Q5 is connected to the emitter of the first transistor Q2. The collector of the third transistor Q3 is connected to the collector of the first transistor Q2. The base of the transistor Q3 receives the collector potential of the second transistor Q5 through an emitter follower section EF2. The collector of the fourth transistor Q4 is connected to the collector of the second transistor Q5. The base of the transistor Q4 receives a reference potential from a first reference potential input terminal TR1. The emitter of the transistor Q4 is connected to the emitter of the third transistor Q3. The collector of the fifth transistor Q6 is connected to the collector of the first transistor Q2. The base of the transistor Q6 receives a set signal from a set signal input terminal TS. The emitter of the transistor Q6 is connected to the emitter of the third transistor Q3. The collector of the sixth transistor Q7 is connected to the emitter of the third transistor Q3. The base of the transistor Q7 receives a latch strobe signal from a latch strobe signal input terminal TE through an input emitter follower section EF1. The emitter of the transistor Q7 is connected to a low-potential side power supply VE through a constant current source CS. The collector of the seventh transistor Q8 is connected to the emitter of the first transistor Q2. The base of the transistor Q8 serves as a second reference potential input terminal TR2. The emitter of the transistor Q8 is connected to the emitter of the sixth transistor Q7.

Note that the input emitter follower section EF1, the internal emitter follower section EF2, and an output emitter follower section EF3 have the same arrangements as those in the first embodiment.

When a latch strobe signal input to the latch strobe signal input terminal TE is at high level, the transistor Q7 is turned on, and one of the transistors Q3, Q4, and Q6 which has the highest base potential is turned on, thus determining a logic value.

Assume that a set signal to the set signal input terminal TS is set at high level. In this case, since the base potential of the transistor Q4 is the reference potential of the first reference potential input terminal TR1, a current flows on the load resistor R1 side regardless of whether the base of the transistor Q3 is at high level or low level. Consequently, output signals from output terminals TQ and TQB are set at high level and low level, respectively, thereby allowing a reliable operation of the set function without level shift resistors required in the prior art, similar to the reset function in the first embodiment.

Similar to the first embodiment, therefore, level shift resistors which are considerably larger in size than other resistors are not required, and hence a reduction in circuit occupation area can be realized. In addition, similar to the first embodiment, since a noise margin equivalent to half the logic amplitude can be ensured, operation errors associated with a set signal can be prevented.

As has been described above, according to the present invention, in an ECL latch circuit, with regard to a signal, of two signal contending against a set or reset signal, which is not inverted in logic, an output from this ECL latch circuit is used as an input by using an internal emitter follower as in the prior art, so that only a signal which can be inverted in logic is used as a reference potential. With this arrangement, level shift resistors which are considerably larger in size than other resistors are not required, and hence a reduction in circuit occupation area can be realized.

This effect is especially conspicuous in an ECL gate array circuit, allowing nearly a 10% reduction in overall chip area. In addition, since a noise margin, with respect to a set or reset signal, equivalent to half the logic amplitude can be ensured, similar to the normal logic, operation errors can be prevented.

What is claimed is:

1. An ECL latch circuit comprising a logic section and having a reset function, said logic section including a first transistor, a second transistor, a third transistor, a fourth transistor, a fifth transistor, a sixth transistor, and a seventh transistor, said first transistor having a collector connected to a ground potential through a first load resistor, and a base serving as a first signal input terminal, said second transistor having a collector connected to the ground potential through a second load resistor, a base serving as a second signal input terminal, and an emitter connected to an emitter of said first transistor, said third transistor having a collector connected to the collector of said first transistor, and a base for receiving a first reference potential, said fourth transistor having a collector connected to the collector of said second transistor, a base for receiving a collector potential of said first transistor through an emitter follower section, and an emitter connected to an emitter of said third transistor, said fifth transistor having a collector connected to the collector of said second transistor, a base for receiving a reset signal, and an emitter connected to the emitter of said third transistor, said sixth transistor having a collector connected to the emitter of said third transistor, a base serving as a third signal input terminal, and an emitter connected to a low-potential side power supply through a constant current source, and said seventh transistor having a collector connected to the emitter of said first transistor, a base serving as a fourth signal input terminal, and an emitter connected to the emitter of said sixth transistor.

2. A circuit according to claim 1, wherein said emitter follower section is constituted by an emitter follower transistor and a constant current source or an emitter follower resistor, and uses an emitter of said emitter follower transistor as an output terminal.

3. A circuit according to claim 1, wherein a reference voltage is applied to one of said first and second signal input terminals.

4. A circuit according to claim 1, wherein a reference voltage is applied to one of said third and fourth signal input terminals.

5. An ECL latch circuit comprising a logic section and having a set function, said logic section including a first transistor, a second transistor, a third transistor, a fourth transistor, a fifth transistor, a sixth transistor, and a seventh transistor, said first transistor having a collector connected to a ground potential through a first load resistor, and a base serving as a first signal input terminal, said second transistor having a collector connected to the ground potential through a second load resistor, a base serving as a second signal input terminal, and an emitter connected to an emitter of said first transistor, said third transistor having a collector connected to the collector of said first transistor, and a base for receiving a collector potential of said second transistor through an emitter follower section, said fourth transistor having a collector connected to the collector of said second transistor, a base for receiving a first reference potential, and an emitter connected to an emitter of said third transistor, said fifth transistor having a collector connected to the collector of said first transistor, a base for receiving a set signal, and an emitter connected to the emitter of said third transistor, said sixth transistor having a collector connected to the emitter of said third transistor, a base serving as a third signal input terminal, and an emitter connected to a low-potential side power supply through a constant current source, and said seventh transistor having a collector connected to the emitter of said first transistor, a base serving as a fourth signal input terminal, and an emitter connected to the emitter of said sixth transistor.

6. A circuit according to claim 5, wherein said emitter follower section is constituted by an emitter follower transistor and a constant current source or an emitter follower resistor, and uses an emitter of said emitter follower transistor as an output terminal.

7. A circuit according to claim 5, wherein a reference voltage is applied to one of said first and second signal input terminals.

8. A circuit according to claim 5, wherein a reference voltage is applied to one of said third and fourth signal input terminals.

* * * * *